Aug. 16, 1960 F. P. HILL 2,949,532

STOP-ON-TUNE RECEIVER HAVING REMOTE CONTROL SPECIFIC CHANNEL SELECTOR

Filed May 18, 1956

INVENTOR.
Frederick P. Hill
BY Mueller & Aichele
Attys.

United States Patent Office 2,949,532

Patented Aug. 16, 1960

2,949,532

STOP-ON-TUNE RECEIVER HAVING REMOTE CONTROL SPECIFIC CHANNEL SELECTOR

Frederick P. Hill, Elgin, Ill., assignor to Motorola, Inc., Chicago, Ill., a corporation of Illinois Filed May 18, 1956, Ser. No. 585,671

3 Claims. (Cl. 250—20)

Figure 1:
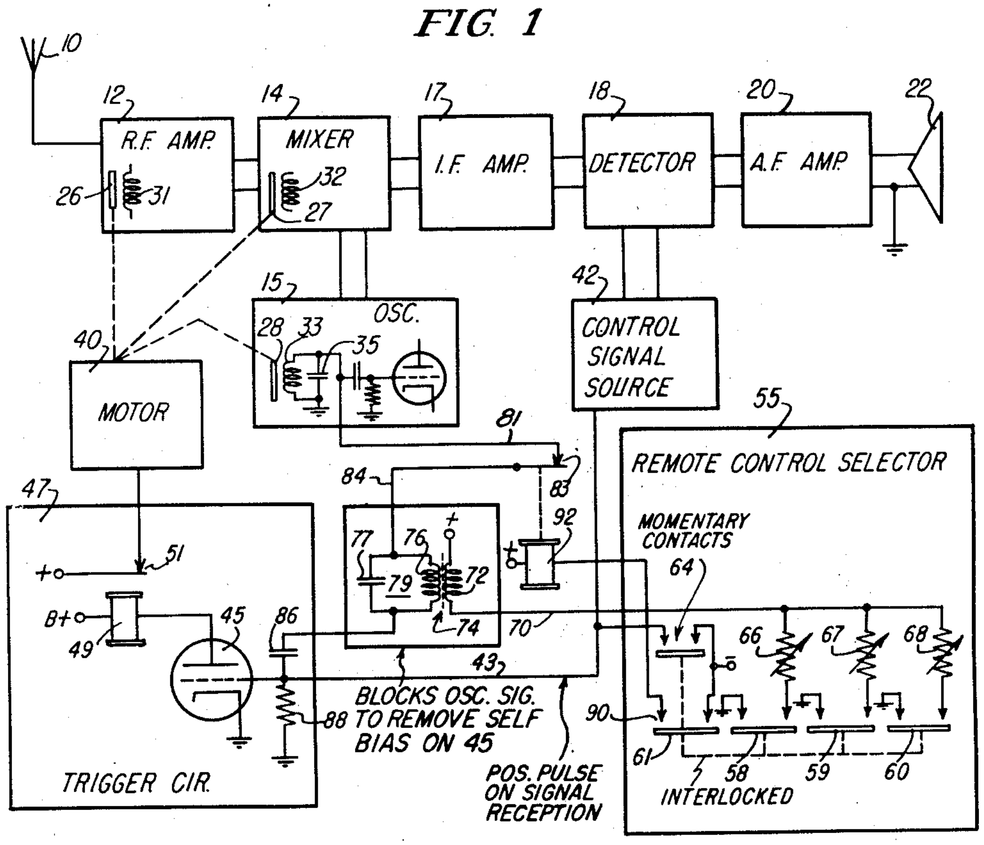

This invention relates to tuning systems for radio receivers and more particularly to remote control of tuning systems of the signal seeking type.

It is often desirable to provide remote tuning of various types of radio receiving equipment. For example, in mobile radio apparatus a receiver may be installed in a position somewhat removed from the location where tuning control of the receiver is to be effected. While there have been such remote tuning systems proposed in the past, some of these have been of rather complex and expensive construction. It may also be advantageous to provide a remote push button control for selecting particular stations and for stop on carrier control for tuning to strong stations which may be available in any area. Such push button and stop on carrier control should be operable from the remote point without requiring complicated electrical and/or mechanical interconnection between the control and the receiver in order to accomplish accurate tuning of the many circuits which may be required in a receiver. Obviously complex interconnection for remote control purposes could set undesirable limitations on the distance over which remote control may be carried out.

It is an object of this invention to provide a reliable and simple remote tuning system for a radio receiver which is of comparatively inexpensive construction.

Another object is to provide a remote tuning control requiring a minimum of circuit leads for the interconnection between the control and the controlled apparatus.

A further object is to provide a remote tuning system which may be incorporated with signal seeker tuning apparatus for a receiver by the addition of but few extra components.

Still another object of the invention is to provide an improved system for remotely tuning a radio receiver merely by variation of direct current in a control circuit.

A feature of the invention is the provision of a superheterodyne radio receiver with a motor driven signal seeking tuner including a remotely operated control system having a variable signal trap adjustable to apply a signal from the local oscillator of the receiver to a control circuit for the signal seeking tuner so that it is responsive to automatically stop the tuning only when the local oscillator is tuned to the frequency of the signal trap.

Another feature is the provision of such a remote tuning control system as described in the preceding paragraph and in which the signal trap comprises a saturable reactor with the direct current therethrough, and thus the frequency to which the trap is tuned, adjustable by means of a remotely located variable resistor to effect control of the signal seeker system and tuning of the receiver merely through adjustment of such variable resistor.

A further feature of the invention is the provision of a remote control system for a signal seeking tuner wherein push button operation is provided by blocking the tuner except at particular frequencies controlled by a direct current voltage established by selecting preset resistors and applied through a single control line. Facilities for selection of preset frequencies and also general signal seeking operation may be included, and remote frequency indication may also be easily provided.

Figure 2:
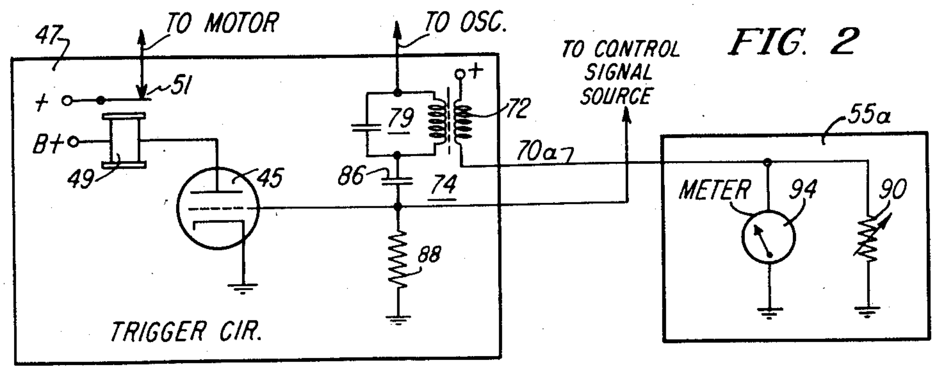

Further objects, features and the attending advantages thereof will be apparent upon consideration of the following description when taken in conjunction with the accompanying drawing in which:

Fig. 1 is a diagram of a radio receiver including the remote tuning system of the present invention; and Fig. 2 is a partial diagram of the receiver illustrating a modified form of the invention.

This invention provides a remote control system for the tuning apparatus of a radio receiver in which a motor is used to drive one or more variable tuned circuits and a control circuit is responsive to a received signal to stop operation of the motor. The system may be used with a receiver having an oscillator providing signals related in frequency to the frequency to which the receiver is tuned, such as a local oscillator in a superheterodyne which is tuned by one of the aforementioned tuned circuits. This oscillator is coupled through an adjustable frequency responsive network to the control circuit providing the stop on carrier action. The frequency responsive network is remotely variable and applies a signal from the oscillator to the control circuit so that it is unresponsive to received signals and therefore will not stop the tuning motor. The frequency responsive network is also tuned to attenuate one frequency, and when the receiver is tuned so that the oscillator produces this frequency which is attenuated, the signal from the oscillator to the control circuit is blocked and the control circuit operates in its normal way to stop the tuner. The frequency responsive network may include a saturable reactor trap so that by remote variation of direct current through the trap, for example, by adjustment of a variable resistor, the control circuit may be made responsive only when the receiver is tuned to a particular frequency. Setting of the frequency responsive network then determines at what frequency setting of the tuned circuits the motor control circuit is responsive so that a received signal at that frequency may stop the motor as it is tuned by the receiver.

The receiver shown in Fig. 1 includes an antenna 10 which applies signals to the radio frequency amplifier circuit 12 where a received signal is selected and amplified. Circuit 12 is coupled to the mixer circuit 14 to which is applied a signal from the local oscillator circuit 15 so that the received signal is converted to a signal of intermediate frequency. This intermediate frequency signal is applied to the intermediate frequency amplifier circuit 17 for further amplification and selection after which it is demodulated in the detector circuit 18. The demodulated signal is then applied to the audio frequency amplifier circuit 20 which amplifies the audio signal so that it may be reproduced as sound in the loudspeaker 22. As described thus far, the receiver may be arranged in accordance with a superheterodyne circuit known and understood in the art.

Circuits 12, 14 and 15 may be tuned respectively by movement of slugs 26, 27, and 28 adjacent the coils 31, 32 and 33 respectively. Coils 31, 32 together with further components not shown are included in networks which are tuned to the frequency of a desired signal. Coil 33 together with capacitor 35 form a tuned circuit which regulates the frequency of the signal generated by oscillator circuit 15 so that it differs in frequency from the frequency to which circuits 12 and 14 are tuned by a fixed amount, namely that of the intermediate frequency signal. An electric motor 40 is mechanically coupled to slugs 26—28 so that when it is energized it mechanically drives these slugs to tune the receiver.

A control signal source 42 is coupled to the detector circuit 18 and this source is adapted to apply a positive control potential to line 43 when a signal of predetermined amplitude reaches the detector. Line 43 is coupled to the control grid of tube 45 in the trigger circuit 47 so that this tube is rendered highly conducting when the receiver is tuned to a station. A relay 49 in the anode circuit of tube 45 has associated contacts 51 which open to remove an energizing potential from motor 40 when the tube 45 is conducting and which close to energize motor 40 when conduction in tube 45 is reduced. Therefore it may be seen that if a potential is applied to line 43 to cause sufficient reduction in current flow in tube 45, motor 40 will be energized to cause the receiver to be tuned or scanned across its tuning range. However, when a carrier of sufficient strength is received, a signal is applied from the control signal source 42 to tube 45 to render the same highly conducting to de-energize motor 40 and leave the receiver tuned to this station. This is, of course, a signal seeking system, various forms of which are known in the art, and the further details of which are not given herein since various systems may be used and the particular system would not change the essences of the invention.

The control panel 55, which may be located in a remote position from the remainder of the equipment, includes apparatus to control the trigger circuit 47 in order to permit remote control tuning of the receiver. Pushbuttons 58, 59 and 60 may be individually operated in order to select given predetermined stations. Pushbutton 61 may be operated in order to set the scanning system in operation so that the receiver will be automatically tuned to the station first detected as the moor 40 (which can be made self reversing) drives the tuning apparatus of the receiver. Buttons 58–61 are interlocked so that operation of one releases a previously operated button and each is adapted to hold its associated contacts closed until released by operation of another one of the buttons. The one exception to this arrangement is contact 64 which is closed when button 61 is depressed but is opened again as soon as an operator of the equipment releases button 61.

It may be seen that operation of buttons 58, 59 and 60 ground one side of resistors 66, 67 and 68 respectively. The other terminals of resistors 66–68 are interconnected and coupled through line 70 and winding 72 of inductance device 74 to a positive potential source. Inductance device 74 includes a further winding 76 which is parallel connected with capacitor 77 to form a parallel tuned circuit 79. The resonant frequency of tuned circuit 79 may be varied according to the amount of direct current passing through winding 72 and this tuned circuit is constructed so that the frequency range thereof is the same as the range through which the oscillator circuit 15 is adapted to tune. Inductance device 74 is a saturable reactor and the tuned circuit 79 may be termed a saturable reactor trap, the rejection frequency of which is regulated by the amount of current flowing through winding 72.

Considering the operation of the remote control system, a portion of the signal generated by oscillator circuit 15 is taken from the tuned circuit 33, 35 thereof and coupled via line 81 through normally closed contacts 83 and through line 84 to one side of the tuned circuit 79. The other side of circuit 79 is coupled through capacitor 86 to the control grid of tube 45. A D.C. path to ground is provided for this grid through resistor 88. Capacitor 86 and resistor 88 comprise a self biasing network and the values thereof are selected so that a portion of the oscillator signal applied to tube 45 will be detected therein to bias the tube sufficiently to cause deenergization of relay 49 and operation of motor 40. However, when oscillator 15 is tuned to produce a signal corresponding in frequency to the resonant frequency of tuned circuit 79, the oscillator signal will be greatly attenuated in circuit 79 and tube 45 will be permitted to respond to the potential on line 43, which potential, as previously mentioned, is adapted to cause conduction of tube 45 when a signal of predetermined level reaches detector 18, thus deenergizing the motor. In summary then, it may be seen that as long as the signal from oscillator circuit 15 is applied to tube 45, motor 40 will be energized to cause the receiver to scan its tuning range. When components 33, 35 of the oscillator are tuned to the frequency of circuit 79, tube 45 will be responsive to a control signal from the control signal source 42 which then causes the motor 40 to stop tuning the receiver since it is on the desired station.

Resistors 66, 67 and 68 are individually adjusted in value so as to regulate the current flow through winding 72 to establish the resonant frequency of tuned circuit 79 to correspond with the frequency to which oscillator 15 is tuned when three different desired stations are tuned by the receiver. Thus when any one of buttons 58–60 is depressed, motor 40 will be energized until one of these desired signals has been tuned in by the receiver.

Pushbutton 61 is utilized in order to effect the usual signal seeking of all strong signals received across the tuning range of the receiver. When that button is operated contacts 64 close momentarily to apply a negative potential to the control grid of tube 45 through line 43 to overcome the positive control signal from source 42 in case the receiver is tuned to a station, thereby insuring energization of motor 40. At the same time contacts 90 close to energize relay 92 and open contacts 83 so that no signal from oscillator 15 is applied to tube 45. When the negative potential is removed by opening of contacts 64, the system is responsive to automatically stop the tuning when the first received signal is developed in detector circuit 18. An operator would continue to operate button 61 until the apparatus had automatically tuned a station to which he desired to listen. If such signal seeking is not desired, of course, it is possible to omit switch 61 and relay 92 and to utilize only a series of buttons and associated resistors such as 58–66 in order to tune any desired number of predetermined stations from the remotely located switch control 55. Relay 92 is used to insure short leads on the oscillator and control signal connections 81 and 84.

Fig. 2 illustrates a modification of the described system in which the control panel 55*a* is coupled to the trigger circuit 47 by way of line 70*a*. The control panel 55*a* includes a variable resistor 90 and a volt meter 94 parallel connected between line 70*a* and ground. Operation of resistor 90 provides a continuously variable change in the current flow through winding 72 of inductance device 74 and thus a continuously variable adjustment of the resonant frequency of tuned circuit 79. Accordingly, any change in the setting of resistor 90 will cause a signal from oscillator circuit 15 to be applied to tube 45 to reduce conduction of this tube and operate the motor until the oscillator frequency is reached which is attenuated by circuit 79 at which time a station detected by circuit 18 will develop a control signal in source 42 to cause relatively heavy conduction of tube 45 and deenergization of the motor 40. Resistor 90, therefore, provides complete tuning of the receiver through variation of the direct current in line 70*a*. Volt meter 94 reads the direct current potential drop across resistor 90 and may be calibrated in frequency corresponding to the range through which circuits 12 and 14 tune thereby providing a dial for the remote switch control 55*a*. The tuning of the trap circuit 79 may be relatively broad so that actual tuning control is provided by the control signal source and the remote control merely conditions the system for operation in the region of a desired signal. Alternatively by providing sharp frequency response characteristics of trap 79, it is possible to omit the control signal source 42 in the circuits of both Figs. 1 and 2 and to tune the receiver merely by adjustment of current in winding 72.

It may be seen that the remote tuning apparatus thus described is of simple and inexpensive construction and that it would furnish remote control through the simple expedient of varying the current in a circuit interconnecting the remote control and the receiver. Only a minimum of additional components are required beyond those used in the usual receiver. The accuracy of tuning is determined primarily by the associated circuits and components included at the receiver location rather than the precise condition of the remote control circuitry. This simplifies installation of the remote control and insures that its operation will not be critical.

I claim:

1. In a radio receiver including oscillator means for producing a signal bearing a given frequency relation to a received signal and variable means for tuning the receiver and the oscillator means: a remote control tuning system for the receiver, including in combination, an electric motor for operating the variable means, a trigger circuit coupled to said motor for energizing and deenergizing the same, tuned circuit means coupled between the oscillator means and said trigger circuit and adapted to apply the signal from the oscillator means to said trigger circuit but tunable to effectively block the signal from the oscillator means, said trigger circuit being responsive to effective blocking of signals from the oscillator means by said tuned circuit means for deenergizing said electric motor, said tuned circuit means being adjustable in frequency response by application of a variable direct current thereto, and a remotely adjustable direct current control circuit coupled to said tuned circuit means for tuning thereof to different frequencies, whereby remote tuning of the receiver is effected by adjustment of said control circuit and operation of said motor so that the oscillator means is tuned to a signal associated with the adjustment of said tuned circuit means.

2. In a radio receiver including oscillator means for producing a signal bearing a given frequency relation to a received signal and variable means for tuning the receiver and the oscillator means: a remote control tuning system for the receiver, including in combination, an electric motor for operating the variable means, a trigger circuit coupled to said motor for energizing and deenergizing the same, a saturable reactor trap coupled between the oscillator means and said trigger circuit and adapted to apply the signal from the oscillator means to said trigger circuit, said trigger circuit including an electron discharge device and bias means responsive to a signal from the oscillator means, and a remotely adjustable direct current control circuit for adjusting the frequency response of said saturable reactor trap, whereby adjustment of said control circuit effects operation of the motor and a received signal is tuned when said saturable reactor trap is tuned to the signal from the oscillator means.

3. In a radio receiver including oscillator means for producing a signal bearing a given frequency relation to a received signal and variable means for tuning the receiver and the oscillator means: a remote control tuning system for the receiver, including in combination, an electric motor for operating the variable means, a trigger circuit coupled to said motor for energizing and deenergizing the same respectively in the absence and presence of a received signal tuned by the variable means, a saturable reactor trap coupled between the oscillator means and said trigger circuit and adapted to apply the signal from the oscillator means to said trigger circuit, said trigger circuit including an electron discharge device and bias means responsive to a received signal with said saturable reactor trap tuned to the signal from the oscillator means and unresponsive thereto with said saturable reactor trap untuned to the signal from the oscillator means, and a remotely adjustable direct current control circuit for adjusting the frequency response of said saturable reactor trap, whereby adjustment of said control circuit effects operation of the motor and a received signal deenergizes the same when said saturable reactor trap is tuned to the signal from the oscillator means.

References Cited in the file of this patent

UNITED STATES PATENTS

| | | |
|---|---|---|
| 2,112,826 | Cook | Apr. 5, 1938 |
| 2,174,566 | Case | Oct. 3, 1939 |
| 2,490,591 | Himmer | Dec. 6, 1949 |
| 2,496,063 | Mural | Jan. 31, 1950 |
| 2,499,875 | Pifer | Mar. 7, 1950 |
| 2,524,281 | Winfield | Oct. 3, 1950 |
| 2,581,202 | Post | Jan. 1, 1952 |
| 2,783,383 | Robbins | Feb. 26, 1957 |

OTHER REFERENCES

IRE Transactions on Broadcast and Television Receivers, October 1955, vol. BTR–1 Number, pp. 5–10.